(12) United States Patent
Nguyen Hoang et al.

(10) Patent No.: US 8,368,105 B2
(45) Date of Patent: Feb. 5, 2013

(54) MANUFACTURING METHOD AND INTEGRATED CIRCUIT HAVING A LIGHT PATH TO A PIXILATED ELEMENT

(75) Inventors: Viet Nguyen Hoang, Leuven (BE); Radu Surdeanu, Roosbeek (BE); Benoit Bataillou, Lyons (FR)

(73) Assignee: NXP, B.V., Eindhoven (NL)

( * ) Notice: Subject to any disclaimer, the term of this patent is extended or adjusted under 35 U.S.C. 154(b) by 255 days.

(21) Appl. No.: 12/922,072

(22) PCT Filed: Mar. 9, 2009

(86) PCT No.: PCT/IB2009/050964
§ 371 (c)(1),
(2), (4) Date: Sep. 10, 2010

(87) PCT Pub. No.: WO2009/113004
PCT Pub. Date: Sep. 17, 2009

(65) Prior Publication Data
US 2011/0012158 A1 Jan. 20, 2011

(30) Foreign Application Priority Data
Mar. 13, 2008 (EP) .................................. 08102591

(51) Int. Cl.
*H01L 33/00* (2010.01)
(52) U.S. Cl. .................. 257/98; 257/432; 257/E31.127; 438/70; 438/29
(58) Field of Classification Search .................. 257/98; 359/228, 232
See application file for complete search history.

(56) References Cited

U.S. PATENT DOCUMENTS

| | | |
|---|---|---|
| 6,507,083 B1 * | 1/2003 | Tian ............................. 257/432 |
| 2004/0227170 A1 | 11/2004 | Jiang |
| 2006/0049885 A1 * | 3/2006 | McCorquodale et al. .... 331/167 |
| 2006/0139780 A1 * | 6/2006 | Matsumoto .................. 359/851 |

(Continued)

OTHER PUBLICATIONS

Soeraasen, O., et al; "From MEMS Devices to Smart Integrated Systems"; Micro and Nanosystems Information Storage and Processing Systems; Springer; Berlin, DE; Vol. 14, No. 7; p. 895-901; (Jan. 8, 2008).

(Continued)

*Primary Examiner* — Kenneth Parker
*Assistant Examiner* — Dale E Page

(57) ABSTRACT

The present invention relates to a manufacturing method of an integrated circuit (IC) comprising a substrate (10) comprising a pixelated element (12) and a light path (38) to the pixelated element (12). The IC comprises a first dielectric layer (14) covering the substrate (10) but not the pixelated element (12), a first metal layer (16) covering a part of the first dielectric layer (14), a second dielectric layer (18) covering a further part of first dielectric layer (14), a second metal layer (20) covering a part of the second dielectric layer (18) and extending over the pixelated element (12) and a part of the first metal layer (16), the first metal layer (16) and the second metal layer (20) forming an air-filled light path (38) to the pixelated element (12). The air-filled light path (38) is formed by creation of holes in the first dielectric layer (14) and the second dielectric layer (18), filling the holes with sacrificial materials, and removal of the sacrificial materials after deposition and patterning of the second metal layer (20). This yields an IC having a low-loss light path to the pixelated element (12). The light path may act as a color filter, e.g. a Fabry-Perot color filter.

6 Claims, 5 Drawing Sheets

U.S. PATENT DOCUMENTS

| | | |
|---|---|---|
| 2006/0177950 A1 | 8/2006 | Lin |
| 2006/0261252 A1 | 11/2006 | Cole et al. |
| 2007/0097694 A1 | 5/2007 | Faase et al. |
| 2007/0125935 A1* | 6/2007 | Yaung ..................... 250/208.1 |

OTHER PUBLICATIONS

International Search Report and Written Opinion for Application PCT/IB2009/050964 (March 9, 2009).

* cited by examiner

MANUFACTURING METHOD AND INTEGRATED CIRCUIT HAVING A LIGHT PATH TO A PIXILATED ELEMENT

The present invention relates to a method of manufacturing a light path to a pixilated element of an integrated circuit.

The present invention further relates to an integrated circuit having a light path to a pixilated element.

Nowadays, many examples exist of integrated circuits that have pixilated elements, e.g. light sensors, light emitting diodes, light valves and so on. In order for light to become available external to the IC or for an external light source to reach the pixilated element, the IC typically comprises a light path between the pixilated element and the outside world.

US patent application No. 2004/0227170 A1 discloses an IC comprising a plurality of photo diodes. Each photo diode is covered by a refractive index material having a refractive index higher than 1, which incorporates a color filter layer. The refractive index material provides a light path to the photo diode. The refractive index materials over the respective photo diodes are separated by air gaps to reduce the amount of cross talk between the photo diodes.

A problem associated with the manufacturing of color filters, and in particular polymer-based color filters is that they are deposited onto the IC relatively early in the manufacturing process, e.g. on top of the pixilated element in a front-end CMOS process. This complicates subsequent process steps such as the back-end process, because the color filters are not thermally stable. This also limits the applicability of such an IC to application domains in which exposure to high temperatures is avoided. For instance, in case the IC is integrated in a solid state lighting device, in which temperatures can exceed 80° C., the use of polymer-based color filters may be unsuitable.

Recently, interferometer-based color filters have been integrated into ICs. Such color filters may be formed in the back-end process, thus limiting the impact of the integration of the color filter on the IC manufacturing process because few subsequent steps (if any) follow the formation of such a light path acting as a color filter.

Figure 1A:
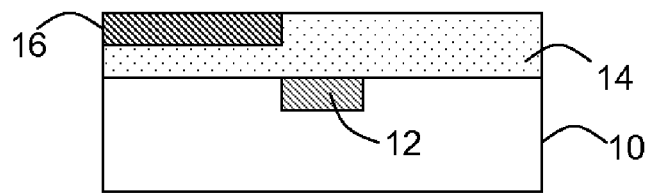
Figure 1B:
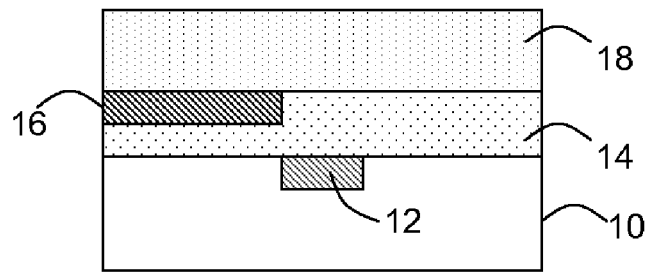
Figure 1C:
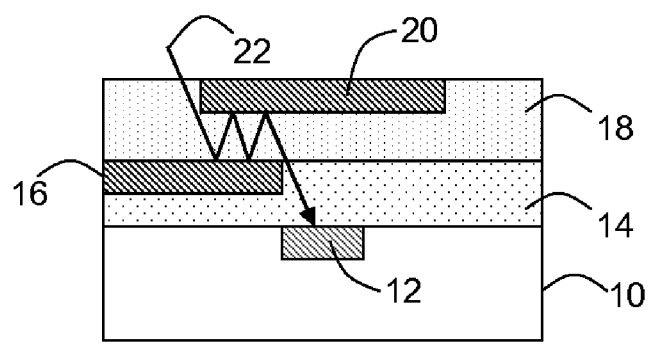

An example of a prior art light path manufacturing method using a conventional CMOS process is shown in FIG. 1A-C. A substrate 10 is provided with a pixilated element 12, and covered with a first dielectric layer 14. The first dielectric layer 14 is patterned, e.g. by means of a dry or wet etching step, after which a first metal layer 16 is formed in the patterned first dielectric layer 14. The patterned first dielectric layer 14 and the first metal layer 16 are subsequently covered with a second dielectric layer 18. The second dielectric layer 18 is subsequently patterned, e.g. by means of a dry or wet etching step, after which a second metal layer 20 is formed in the second dielectric layer 18. The first and metal layers act as reflective surfaces to the incident light 22 traveling through the first and second dielectric layers, thereby forming a Fabry-Perot type interferometer acting as a color filter.

A disadvantage of such a color filter is that the dielectric materials also cause losses of the light having the intended wavelength, e.g. by partially absorbing the light, thus reducing the amount of incident light reaching the pixilated element (or the boundary of the IC in case of a light emitting pixilated element). This for instance complicates the determination of an incident light intensity in case of the pixilated element being a photo-sensitive element such as a photo diode.

Hence, there exists a need for a manufacturing method that yields an IC having a light path to a pixilated element for which the light losses are reduced compared to the aforementioned prior art.

According to a first aspect of the present invention, there is provided a method of manufacturing a light path to a pixilated element of an integrated circuit, comprising providing a substrate comprising the pixilated element; depositing a first dielectric layer over the substrate; forming an opening in the first dielectric layer over the pixilated element; filling the opening with a first sacrificial material; forming a first metal layer over a part of the first dielectric layer adjacent to pixilated element; depositing a second dielectric layer over the first dielectric layer, the first sacrificial material and the first metal layer; forming a further opening in the second dielectric layer such that the first sacrificial material and the first metal layer are at least partially exposed; filling the further opening with a second sacrificial material; forming an second metal layer over a part of the second dielectric layer and a part of the second sacrificial material such that a part of the first metal layer, a part of the second sacrificial layer and a part of the second metal layer form a stack; and removing the first sacrificial material and the second sacrificial material.

The manufacturing method of the present invention can be incorporated in a conventional manufacturing process, e.g. a CMOS process, and yields an IC having a light path in which the dielectric material comprises air. Because air absorbs much smaller amounts of light than solid state dielectrics, the light yield of the light path is significantly improved.

Preferably, the first sacrificial material and the second sacrificial material are thermal decomposable polymers. This has the advantage that the sacrificial materials may be removed by means of a single thermal budget, i.e. a single heat treatment step. The first and second sacrificial materials may be the same material, or may be different materials.

The first metal layer may be embedded in the first dielectric layer by forming a recess in the first dielectric layer and filling said recess with the first metal layer. Similarly, the second dielectric layer may be formed by forming a further recess in the second dielectric layer and the second sacrificial material and filling the further recess with the second metal layer.

According to a further aspect of the present invention, there is provided an integrated circuit comprising a substrate comprising a pixilated element; a first dielectric layer covering the substrate but not the pixilated element; a first metal layer covering a part of the first dielectric layer; a second dielectric layer covering a further part of the first dielectric layer; a second metal layer covering a part of the second dielectric layer and extending over the pixilated element and a part of the first metal layer, the first metal layer and the second metal layer forming an air-filled light path to the pixilated element.

Such an integrated circuit may be manufactured by the method of the present invention, and has the advantage that an air-filled light path, which may act as a color filter, is obtained, thus limiting the light losses of light travelling through said light path. The pixilated element may comprise a light sensitive element, e.g. a photo diode, a light emitting element, e.g. a light emitting diode or a light valve, e.g. a liquid crystal display pixel.

Embodiments of the invention are described in more detail and by way of non-limiting examples with reference to the accompanying drawings, wherein:

FIG. 1A-C depict a prior art light path manufacturing method;

FIG. 2A-I depict a light path manufacturing method according to an embodiment of the present invention; and FIG. 3A-I depict a light path manufacturing method according to another embodiment of the present invention.

It should be understood that the Figures are merely schematic and are not drawn to scale. It should also be understood that the same reference numerals are used throughout the Figures to indicate the same or similar parts.

According to a first embodiment of the manufacturing method of the present invention, a substrate 10 is provided comprising a pixilated element 12. Since the manufacturing of such pixilated elements is well-known and the present invention is not concerned with the manufacturing of such elements per se, this will not be further explained for reasons of brevity only. In a next step, a first dielectric layer 14 is deposited over the substrate 12. Such a dielectric layer may be a silicon oxide or a silicon nitride layer, or any other suitable dielectric layer. The first dielectric layer 14 may be deposited in any suitable way.

Figure 2A:
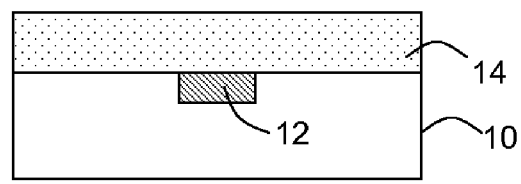
Figure 2B:
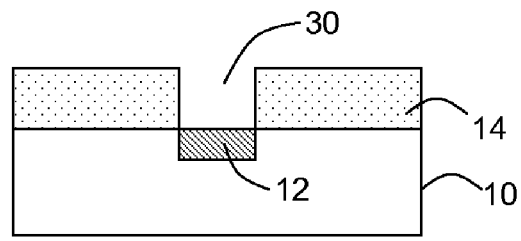

In a next step, depicted in FIG. 2B, an opening 30 is formed in the first dielectric layer 14 such that at least a part of the aperture, but preferably the whole aperture of the pixilated element 12 is exposed. The opening may be formed by means of any suitable etching step, e.g. a dry etch or a wet etch. Other alternatives will be apparent to the skilled person.

Figure 2C:
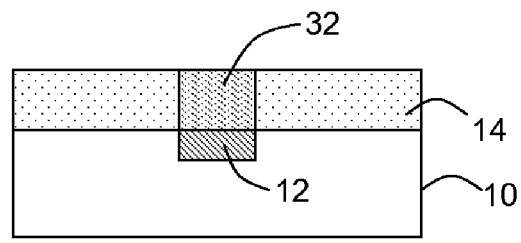

In FIG. 2C, the opening 30 is filled with a first sacrificial material 32. This may be a material having a much lower resistance to a subsequent etching step than the other layers of the integrated circuit such that the first sacrificial layer 32 can be selectively removed at a later stage by means of a selective etching step, e.g. by exposing the substrate 10 and additional layers to a $XeF_6$ etching step. A number of suitable materials and etchants can be found in US patent application No. 2006/0177950 A1.

However, in a preferred embodiment, the first sacrificial material 32 is a thermally decomposable polymer (TDP) such as polynorbornene, a polycarbonate type polymer or any other suitable TDP, which may be removed by means of exposing the substrate stack to a thermal budget. Since such a step is less vigorous than exposing the stack to an etching step, there is less risk of accidental damage to the stack during the removal of the sacrificial layer. Following the deposition of the first sacrificial material 32, excess first sacrificial material 32 on the exposed surface of the first dielectric layer 14 may be removed by means of a (dry) etch-back or a chemical-mechanical polishing step.

Figure 2D:
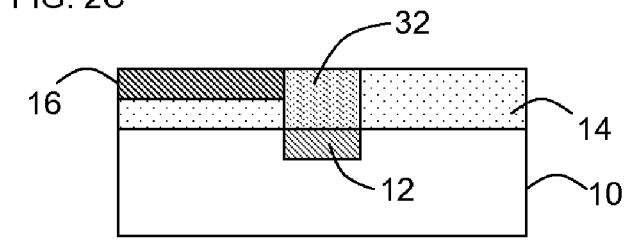
Figure 2E:
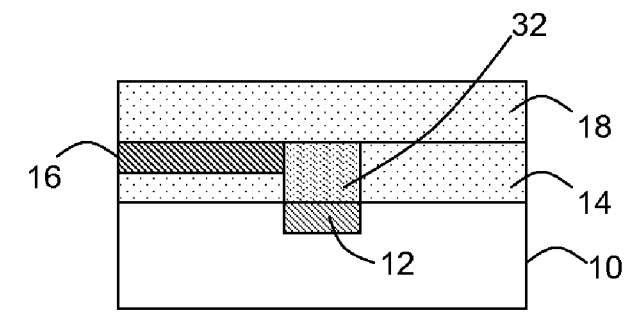

In a next step, shown in FIG. 2D, the first dielectric layer is patterned and subsequently filled with a first metal such that a first metal layer 16 is formed adjacent to the first sacrificial layer 32. Next, as shown in FIG. 2E, a second dielectric layer 18 is deposited over the first dielectric layer 14, the first sacrificial material 32 and the first metal layer 16. The first dielectric layer 14 and the second dielectric layer 18 may comprise the same dielectric material or may comprise different dielectric materials. The second dielectric layer 18 may be formed in any suitable way, e.g. by means of chemical vapor deposition (CVD) deposition, which may be plasma-enhanced. Other suitable ways of depositing a dielectric layer will be apparent to the skilled person.

Figure 2F:
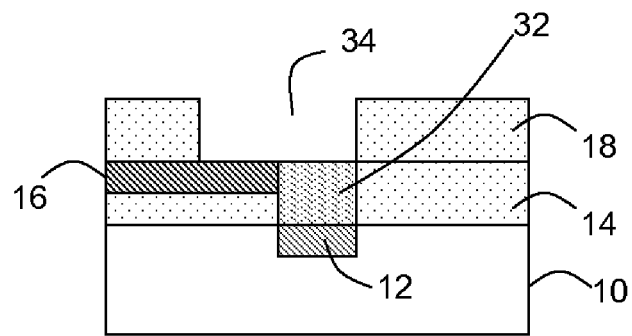

FIG. 2F shows a next step of the manufacturing process in which an opening 34 is formed in the second dielectric layer 18, e.g. by means of a suitable etching step. The opening 34 exposes at least a part of the first sacrificial material 32, and preferably the whole surface of the first sacrificial material 32, and further exposes at least a part of the surface of the first metal layer 16. In other words, the opening 34 covers at least a part of the pixilated element 12 and laterally extends beyond the pixilated element 12.

Figure 2G:
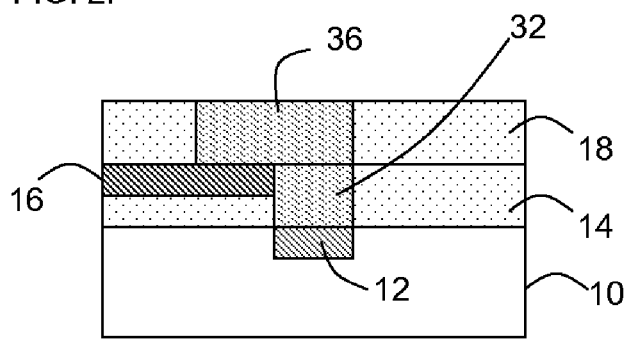

As shown in FIG. 2G, the opening 34 is subsequently filled with a second sacrificial material 36. The second sacrificial material 36 may be again be a material having a much lower resistance to a subsequent etching step than the non-sacrificial layers of the integrated circuit such that the first sacrificial layer 32 and the second sacrificial layer 36 can be selectively removed at a later stage by means of a selective etching step, e.g. by exposing the substrate stack to a $XeF_6$ etching step. However, in a preferred embodiment, the second sacrificial material 36 is a thermally decomposable polymer (TDP) such as polynorbornene, a polycarbonate type polymer or any other suitable TDP, which may be removed by means of exposing the substrate stack to a thermal budget. Preferably, the second sacrificial material 36 is chosen such that the first sacrificial material 32 and the second sacrificial material 36 may be removed in a single processing step. The first sacrificial material 32 and the second sacrificial material 36 may be the same materials, although this is not strictly necessary.

Following the deposition of the second sacrificial material 36, excess second sacrificial material 36 on the exposed surface of the second dielectric layer 18 may be removed by means of a (dry) etch-back or a chemical-mechanical polishing step.

Figure 2H:
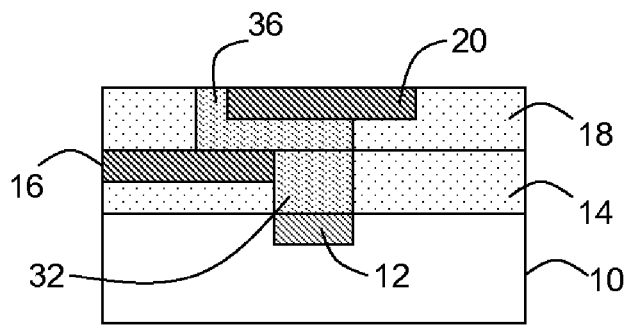

FIG. 2H shows the following step of the manufacturing method of the present invention, in which the second dielectric layer 18 is patterned and subsequently filled with a second metal, thereby forming the second metal layer 20. The second metal layer 20 extends over the second sacrificial material 36 and a part of the first metal layer 16. Thus, the second metal layer 20 ensures that no direct light path, i.e. a path through which light may travel without reflections, exists between the pixilated element 12 and a point external to the IC.

It should be understood that in the context of the present invention, the phrase 'metal' in the context of the first metal layer 16 and the second metal layer 20 is intended to include metals, metal alloys as well as metallic materials at least partially covered by a dielectric such as an oxide layer. The respective metals in the first metal layer 16 and the second metal layer 20 may be the same metals or may be different metals. In an embodiment, these metals may be chosen from the group of metals consisting of W, Al, Cu, and alloys thereof, or may be combinations of metals from these group, e.g. in the form of a multi-layered metal stack.

Figure 2I:
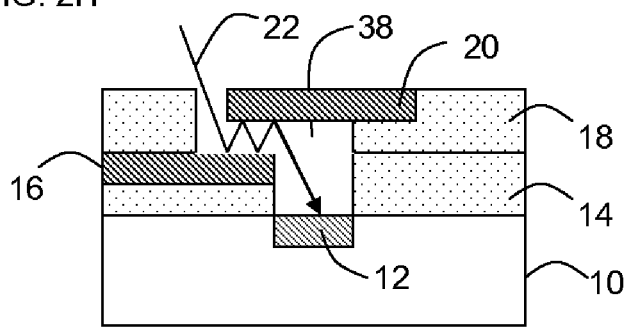

In FIG. 2I, the light path 38 is formed by removing the first sacrificial material 32 and the second sacrificial material 36. In case of TDP materials, the removal of these materials may be achieved by exposing the substrate stack to an elevated temperature such that the TDP materials decompose. In FIG. 2I, the light path 38 forms a Fabry-Perot type color filter, as demonstrated by the interference reflections of incident light 22, in which the dielectric material between the reflective surfaces of the interferometer is air. Consequently, a light path is formed in which light losses through light absorption by the dielectric material of the light path are significantly reduced. The respective metals in the first metal layer 16 and the second metal layer 20 may be chosen to maximize the reflective properties of the metals with respect to the light wavelength of interest.

The light path 38 may be subsequently filled with a fluid to adjust the properties of the light path if so desired. The substrate stack may be subjected to further processing steps to complete the formation of the IC of the present invention. These optional steps are not shown for reasons of brevity only. It will be appreciated that the above described process may be realized using conventional CMOS processing steps, which means that the IC of the present invention can be routinely manufactured in CMOS technology, thereby limiting the cost of the IC of the present invention.

It should also be appreciated that at least some of the process steps in FIGS. 2A-I may be modified without departing from the teachings of the present invention. For instance, FIGS. 3A-I show a modified manufacturing process, in which the first metal layer 16 and the second metal layer 20 are deposited on top of the first dielectric layer 14 and the second dielectric layer 18 respectively. This may for instance be realized by selective deposition of these metals. Alternatively, a further sacrificial layer (not shown) may be deposited over the dielectric layer, e.g. first dielectric layer 14 and the first sacrificial material 32. This further sacrificial layer may be patterned such that the first metal layer 16 may be formed in the patterned further sacrificial layer after which the further sacrificial layer may be removed without removing the first sacrificial material 32. To this end, the first sacrificial material 32 and the further sacrificial layer must be formed from different materials.

Figure 3A:
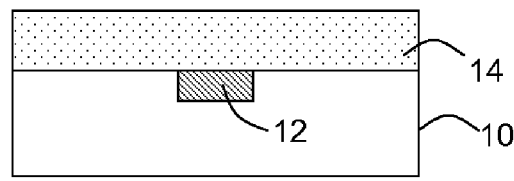
Figure 3B:
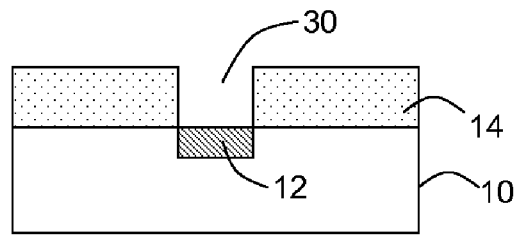
Figure 3C:
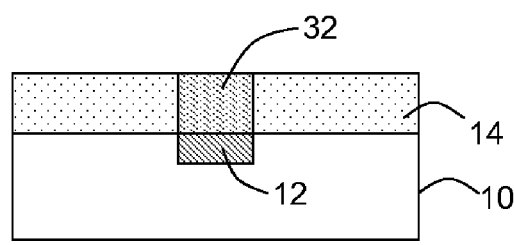
Figure 3D:
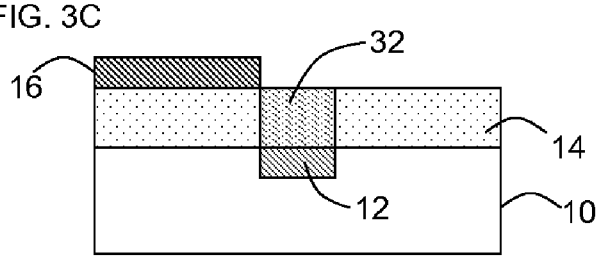
Figure 3E:
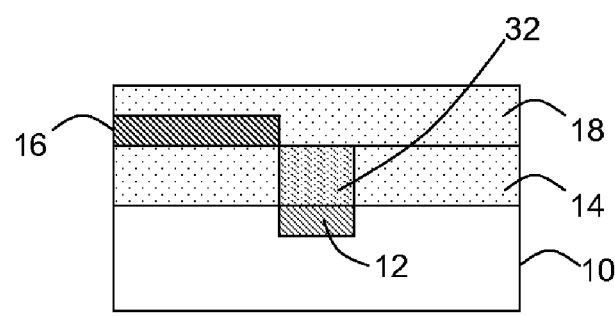
Figure 3F:
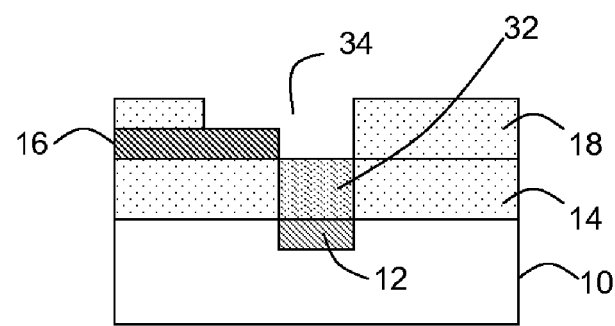
Figure 3G:
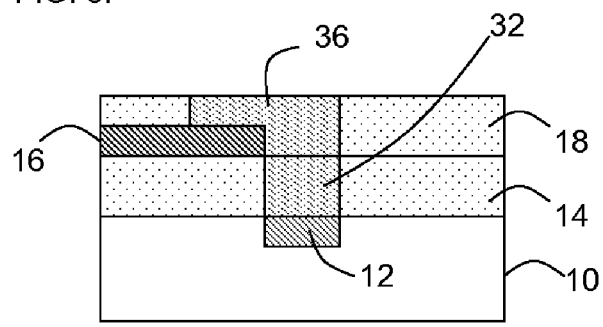
Figure 3H:
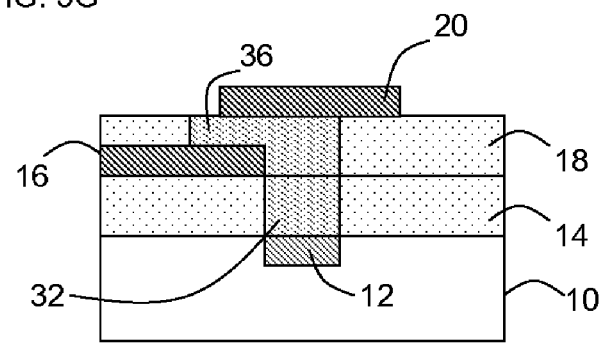
Figure 3I:
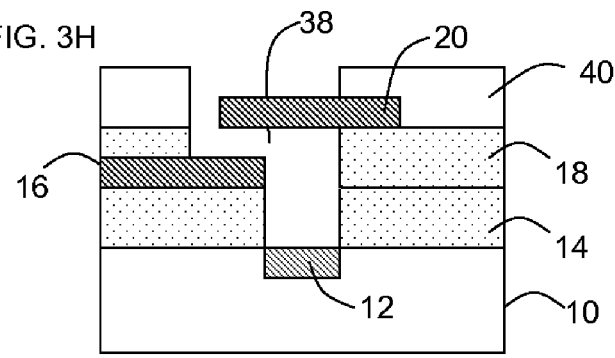

Refer to FIG. 3I. The second metal layer 20 may be formed in a similar manner. A further dielectric layer 40 may be added to provide additional stability to the second metal layer 20; the second metal layer 20 is embedded in the further dielectric layer 40. For instance, the first metal layer 16 may comprise Cu, which may be patterned by means of a damascene patterning process, whereas the second metal layer 20 may comprise Al or an Al alloy, which may be patterned using a dry etch process after which the patterned Al or Al alloy structures may be filled in with a dielectric such as dielectric layer 40.

The IC of the present invention as schematically depicted in FIG. 2I and FIG. 3I may be advantageously used in an electronic device such as a digital camera. The improved accuracy of the pixilated element facilitates improvement in the accuracy of a color image produced with such an electronic device. Hence, the improvements to the IC of the present invention can be utilized to improve other aspects of such electronic devices.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing an integrated circuit comprising a light path to a pixilated element, the method comprising:
    providing a substrate comprising the pixilated element;
    depositing a first dielectric layer over the substrate;
    forming an opening in the first dielectric layer over the pixilated element;
    filling the opening with a first sacrificial material;
    forming a first metal layer over a part of the first dielectric layer adjacent to the first sacrificial material;
    depositing a second dielectric layer over the first dielectric layer, the first sacrificial material and the first metal layer;
    forming a further opening in the second dielectric layer such that the first sacrificial material and the first metal layer are at least partially exposed;
    filling the further opening with a second sacrificial material;
    forming an second metal layer over a part of the second dielectric layer and a part of the second sacrificial material such that a part of the first metal layer, a part of the second sacrificial layer and a part of the second metal layer form a stack; and
    removing the first sacrificial material and the second sacrificial material.

2. A method according to claim 1, wherein the first sacrificial material and the second sacrificial material are the same material.

3. A method according to claim 1, wherein the first sacrificial material and the second sacrificial material respectively comprise thermal decomposable polymers, and wherein the step of removing the first sacrificial material and the second sacrificial material comprises exposing said materials to a thermal budget.

4. A method according to claim 1, wherein the step of forming the first metal layer comprises:
    forming a recess in the first dielectric layer adjacent to the first sacrificial material; and
    filling the recess with a first metal.

5. A method according to claim 1, wherein the step of forming the second metal layer comprises:
    forming a further recess in the second dielectric layer and the second sacrificial material; and
    filling the further recess with a second metal.

6. A method according to claim 1, wherein the light path acts as a color filter.

* * * * *